(12) United States Patent
Raymond et al.

(10) Patent No.: US 10,453,826 B2
(45) Date of Patent: Oct. 22, 2019

(54) VOLTAGE-BALANCED SERIAL ILED PIXEL AND DISPLAY

(71) Applicant: X-Celeprint Limited, Cork (IE)

(72) Inventors: Brook Raymond, Cary, NC (US); Ronald S. Cok, Rochester, NY (US); Matthew Meitl, Durham, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/610,297

(22) Filed: May 31, 2017

(65) Prior Publication Data

US 2017/0352647 A1    Dec. 7, 2017

Related U.S. Application Data

(60) Provisional application No. 62/345,304, filed on Jun. 3, 2016.

(51) Int. Cl.
*H01L 25/075* (2006.01)
*G09G 3/32* (2016.01)
*H01L 33/62* (2010.01)

(52) U.S. Cl.
CPC ........... *H01L 25/0753* (2013.01); *G09G 3/32* (2013.01); *G09G 2300/0452* (2013.01); *G09G 2320/0666* (2013.01); *H01L 33/62* (2013.01)

(58) Field of Classification Search
CPC .................. G09G 3/32; G09G 2300/0452
See application file for complete search history.

(56) References Cited

U.S. PATENT DOCUMENTS

| 5,550,066 A | 8/1996 | Tang et al. |
| 5,621,555 A | 4/1997 | Park |
| 5,731,802 A | 3/1998 | Aras et al. |

(Continued)

FOREIGN PATENT DOCUMENTS

| GB | 2 496 183 A | 5/2013 |
| WO | WO-2006/027730 A1 | 3/2006 |

(Continued)

OTHER PUBLICATIONS

Cok, R. S. et al., AMOLED displays with transfer-printed integrated circuits, Journal of SID 19/(4):335-341(2011).

(Continued)

*Primary Examiner* — Kent W Chang
*Assistant Examiner* — Nathaniel P Brittingham
(74) *Attorney, Agent, or Firm* — William R. Haulbrook; Michael D. Schmitt; Choate, Hall & Stewart LLP

(57) ABSTRACT

A multi-color inorganic light-emitting diode (iLED) display includes a display substrate with a common voltage signal and a common ground signal and a plurality of multi-color pixels. In certain embodiments, each multi-color pixel includes a first color sub-pixel including two or more first iLEDs, a second color sub-pixel including one or more second iLEDs, and a third color sub-pixel including one or more third iLEDs. The two or more first iLEDs are serially connected between the common voltage signal and the common ground signal, the one or more second iLEDs are serially connected between the common voltage signal and the common ground signal, and the one or more third iLEDs are serially connected between the common voltage signal and the common ground signal.

20 Claims, 7 Drawing Sheets

(56) References Cited

U.S. PATENT DOCUMENTS

| | | | |
|---|---|---|---|
| 5,815,303 A | 9/1998 | Berlin | |
| 5,912,712 A | 6/1999 | Doherty | |
| 5,994,722 A | 11/1999 | Averbeck et al. | |
| 6,084,579 A | 7/2000 | Hirano | |
| 6,142,358 A | 11/2000 | Cohn et al. | |
| 6,184,477 B1 | 2/2001 | Tanahashi | |
| 6,278,242 B1 | 8/2001 | Cok et al. | |
| 6,392,340 B2 | 5/2002 | Yoneda et al. | |
| 6,448,718 B1 | 9/2002 | Battersby | |
| 6,466,281 B1 | 10/2002 | Huang et al. | |
| 6,577,367 B2 | 6/2003 | Kim | |
| 6,660,457 B1 | 12/2003 | Imai et al. | |
| 6,717,560 B2 | 4/2004 | Cok et al. | |
| 6,756,576 B1 | 6/2004 | McElroy et al. | |
| 6,812,637 B2 | 11/2004 | Cok et al. | |
| 6,933,532 B2 | 8/2005 | Arnold et al. | |
| 7,012,382 B2 | 3/2006 | Cheang et al. | |
| 7,091,523 B2 | 8/2006 | Cok et al. | |
| 7,129,457 B2 | 10/2006 | McElroy et al. | |
| 7,195,733 B2 | 3/2007 | Rogers et al. | |
| 7,288,753 B2 | 10/2007 | Cok | |
| 7,354,801 B2 | 4/2008 | Sugiyama et al. | |
| 7,402,951 B2 | 7/2008 | Cok | |
| 7,420,221 B2 | 9/2008 | Nagai | |
| 7,443,438 B2 | 10/2008 | Kakumoto et al. | |
| 7,466,075 B2 | 12/2008 | Cok et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,622,367 B1 | 11/2009 | Nuzzo et al. | |
| 7,662,545 B2 | 2/2010 | Nuzzo et al. | |
| 7,687,812 B2 | 3/2010 | Louwsma et al. | |
| 7,704,684 B2 | 4/2010 | Rogers et al. | |
| 7,738,001 B2 | 6/2010 | Routley et al. | |
| 7,791,271 B2 | 9/2010 | Cok et al. | |
| 7,799,699 B2 | 9/2010 | Nuzzo et al. | |
| 7,816,856 B2 | 10/2010 | Cok et al. | |
| 7,834,541 B2 | 11/2010 | Cok | |
| 7,893,612 B2 | 2/2011 | Cok | |
| 7,919,342 B2 | 4/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,969,085 B2 | 6/2011 | Cok | |
| 7,972,875 B2 | 7/2011 | Rogers et al. | |
| 7,982,296 B2 | 7/2011 | Nuzzo et al. | |
| 7,990,058 B2 | 8/2011 | Cok et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,115,380 B2 | 2/2012 | Cok et al. | |
| 8,198,621 B2 | 6/2012 | Rogers et al. | |
| 8,207,547 B2 | 6/2012 | Lin | |
| 8,207,635 B2 | 6/2012 | Covaro | |
| 8,243,027 B2 | 8/2012 | Hotelling et al. | |
| 8,261,660 B2 | 9/2012 | Menard | |
| 8,334,545 B2 | 12/2012 | Levermore et al. | |
| 8,394,706 B2 | 3/2013 | Nuzzo et al. | |
| 8,421,791 B2 | 4/2013 | Harada | |
| 8,440,546 B2 | 5/2013 | Nuzzo et al. | |
| 8,450,927 B2 | 5/2013 | Lenk et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,558,243 B2 | 10/2013 | Bibl et al. | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,835,940 B2 | 9/2014 | Hu et al. | |
| 8,854,294 B2 | 10/2014 | Sakariya | |
| 8,865,489 B2 | 10/2014 | Rogers et al. | |
| 8,877,648 B2 | 11/2014 | Bower et al. | |
| 8,889,485 B2 | 11/2014 | Bower | |
| 8,895,406 B2 | 11/2014 | Rogers et al. | |
| 8,941,215 B2 | 1/2015 | Hu et al. | |
| 8,987,765 B2 | 3/2015 | Bibl et al. | |
| 9,105,714 B2 | 8/2015 | Hu et al. | |
| 9,111,464 B2 | 8/2015 | Bibl et al. | |
| 9,153,171 B2 | 10/2015 | Sakariya et al. | |
| 9,161,448 B2 | 10/2015 | Menard et al. | |
| 9,166,114 B2 | 10/2015 | Hu et al. | |
| 9,178,123 B2 | 11/2015 | Sakariya et al. | |
| 9,202,996 B2 | 12/2015 | Orsley et al. | |
| 9,217,541 B2 | 12/2015 | Bathurst et al. | |
| 9,240,397 B2 | 1/2016 | Bibl et al. | |
| 9,252,375 B2 | 2/2016 | Bibl et al. | |
| 9,358,775 B2 | 6/2016 | Bower et al. | |
| 9,367,094 B2 | 6/2016 | Bibl et al. | |
| 9,412,727 B2 | 8/2016 | Menard et al. | |
| 9,478,583 B2 | 10/2016 | Hu et al. | |
| 9,484,504 B2 | 11/2016 | Bibl et al. | |
| 9,520,537 B2 | 12/2016 | Bower et al. | |
| 9,555,644 B2 | 1/2017 | Rogers et al. | |
| 9,570,532 B2 * | 2/2017 | Huangfu | G09G 3/3225 |
| 9,583,533 B2 | 2/2017 | Hu et al. | |
| 9,601,356 B2 | 3/2017 | Bower et al. | |
| 9,626,908 B2 | 4/2017 | Sakariya et al. | |
| 9,640,108 B2 | 5/2017 | Cok et al. | |
| 9,640,715 B2 | 5/2017 | Bower et al. | |
| 9,660,008 B2 | 5/2017 | Bower et al. | |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,786,646 B2 | 10/2017 | Cok et al. | |
| 9,818,725 B2 | 11/2017 | Bower et al. | |
| 9,865,832 B2 | 1/2018 | Bibl et al. | |
| 9,905,159 B2 | 2/2018 | Genoe | |
| 9,923,133 B2 | 3/2018 | Bower et al. | |
| 9,928,771 B2 | 3/2018 | Cok | |
| 9,929,053 B2 | 3/2018 | Bower et al. | |
| 9,930,277 B2 | 3/2018 | Cok | |
| 10,091,446 B2 | 10/2018 | Cok et al. | |
| 10,157,563 B2 | 12/2018 | Cok et al. | |
| 10,158,819 B2 | 12/2018 | Cok | |
| 2001/0022564 A1 | 9/2001 | Youngquist et al. | |
| 2002/0078559 A1 | 6/2002 | Buchwalter et al. | |
| 2002/0096994 A1 | 7/2002 | Iwafuchi et al. | |
| 2002/0154101 A1 | 10/2002 | Abe et al. | |
| 2003/0062545 A1 | 4/2003 | Yamazaki et al. | |
| 2003/0189829 A1 | 10/2003 | Shimizu et al. | |
| 2003/0201986 A1 | 10/2003 | Willis et al. | |
| 2003/0223275 A1 | 12/2003 | Abe | |
| 2004/0140763 A1 | 7/2004 | Buchwalter et al. | |
| 2004/0212296 A1 | 10/2004 | Nakamura et al. | |
| 2004/0227704 A1 | 11/2004 | Wang et al. | |
| 2004/0252933 A1 | 12/2004 | Sylvester et al. | |
| 2005/0012076 A1 | 1/2005 | Morioka | |
| 2005/0040754 A1 | 2/2005 | Sakurai | |
| 2005/0104833 A1 | 5/2005 | Ochi et al. | |
| 2005/0116621 A1 | 6/2005 | Bellmann et al. | |
| 2005/0140275 A1 | 6/2005 | Park | |
| 2005/0168987 A1 | 8/2005 | Tamaoki et al. | |
| 2005/0253159 A1 * | 11/2005 | Creswick | H01L 23/13 |
| | | | 257/98 |
| 2005/0275615 A1 | 12/2005 | Kahen et al. | |
| 2006/0063309 A1 | 3/2006 | Sugiyama et al. | |
| 2006/0170623 A1 | 8/2006 | Naugler et al. | |
| 2007/0035340 A1 | 2/2007 | Kimura | |
| 2007/0077349 A1 | 4/2007 | Newman et al. | |
| 2007/0132674 A1 | 6/2007 | Tsuge | |
| 2007/0201056 A1 | 8/2007 | Cok et al. | |
| 2007/0216610 A1 * | 9/2007 | Smith | H01L 27/3204 |
| | | | 345/76 |
| 2007/0252856 A1 | 11/2007 | Hudson et al. | |
| 2008/0174515 A1 | 7/2008 | Matthies et al. | |
| 2008/0180381 A1 | 7/2008 | Jeong et al. | |
| 2008/0259019 A1 | 10/2008 | Ng | |
| 2009/0096742 A1 | 4/2009 | Huang | |

(56) References Cited

U.S. PATENT DOCUMENTS

| | | |
|---|---|---|
| 2009/0147033 A1 | 6/2009 | Arai et al. |
| 2009/0273303 A1 | 11/2009 | Peng |
| 2009/0289559 A1 | 11/2009 | Tanaka et al. |
| 2009/0315054 A1 | 12/2009 | Kim et al. |
| 2010/0039030 A1 | 2/2010 | Winters et al. |
| 2010/0045690 A1 | 2/2010 | Handschy et al. |
| 2010/0078670 A1 | 4/2010 | Kim et al. |
| 2010/0085295 A1 | 4/2010 | Zhao et al. |
| 2010/0123268 A1 | 5/2010 | Menard |
| 2010/0156766 A1 | 6/2010 | Levey et al. |
| 2010/0207848 A1 | 8/2010 | Cok |
| 2010/0207852 A1 | 8/2010 | Cok |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0317132 A1 | 12/2010 | Rogers et al. |
| 2011/0057861 A1 | 3/2011 | Cok et al. |
| 2011/0084993 A1 | 4/2011 | Kawabe |
| 2011/0199011 A1 | 8/2011 | Nakazawa |
| 2011/0211348 A1 | 9/2011 | Kim |
| 2012/0126229 A1 | 5/2012 | Bower |
| 2012/0206421 A1 | 8/2012 | Cok et al. |
| 2012/0206499 A1 | 8/2012 | Cok |
| 2012/0228669 A1 | 9/2012 | Bower et al. |
| 2012/0307123 A1 | 12/2012 | Cok et al. |
| 2012/0314388 A1 | 12/2012 | Bower et al. |
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0141469 A1 | 6/2013 | Xu |
| 2013/0153277 A1 | 6/2013 | Menard et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0055654 A1 | 2/2014 | Borthakur et al. |
| 2014/0104243 A1 | 4/2014 | Sakariya et al. |
| 2014/0159043 A1 | 6/2014 | Sakariya et al. |
| 2014/0184667 A1 | 7/2014 | Xu |
| 2014/0217448 A1 | 8/2014 | Kim et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0181148 A1 | 6/2015 | Slovick et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0302795 A1 | 10/2015 | Genoe |
| 2015/0362165 A1* | 12/2015 | Chu .................. H01L 25/0753 362/235 |
| 2015/0371585 A1 | 12/2015 | Bower et al. |
| 2015/0371591 A1 | 12/2015 | Suzuki et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0093600 A1 | 3/2016 | Bower et al. |
| 2016/0118026 A1 | 4/2016 | Loo et al. |
| 2016/0119565 A1 | 4/2016 | Fujita et al. |
| 2016/0127668 A1 | 5/2016 | Fujita et al. |
| 2016/0163253 A1 | 6/2016 | Chaji et al. |
| 2016/0212361 A1 | 7/2016 | Suzuki |
| 2016/0276326 A1 | 9/2016 | Natarajan et al. |
| 2016/0343771 A1 | 11/2016 | Bower et al. |
| 2017/0040371 A1 | 2/2017 | Izuhara |
| 2017/0047393 A1 | 2/2017 | Bower et al. |
| 2017/0061867 A1 | 3/2017 | Cok et al. |
| 2017/0084671 A1* | 3/2017 | Hack .................. H01L 27/3225 |
| 2017/0154819 A1 | 6/2017 | Bower et al. |
| 2017/0186356 A1 | 6/2017 | Cok |
| 2017/0187976 A1 | 6/2017 | Cok |
| 2017/0188427 A1 | 6/2017 | Cok et al. |
| 2017/0206820 A1 | 7/2017 | Cok et al. |
| 2017/0206845 A1 | 7/2017 | Sakariya et al. |
| 2017/0330509 A1 | 11/2017 | Cok et al. |
| 2017/0338374 A1 | 11/2017 | Zou et al. |
| 2017/0352647 A1* | 12/2017 | Raymond ........... H01L 25/0753 |
| 2018/0131886 A1 | 5/2018 | Cok |
| 2018/0166512 A1* | 6/2018 | Hack .................. H01L 27/3218 |
| 2018/0191978 A1 | 7/2018 | Cok et al. |
| 2018/0197471 A1 | 7/2018 | Rotzoll et al. |
| 2018/0315793 A1 | 11/2018 | Zhu et al. |

FOREIGN PATENT DOCUMENTS

| | | |
|---|---|---|
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |

OTHER PUBLICATIONS

Hamer et al., 63.2: AMOLED Displays Using Transfer-Printed Integrated Circuits, SID 09 Digest, 40(2):947-950 (2009).

Lee, S. H. etal, Laser Lift-Off of GaN Thin Film and its Application to the Flexible Light Emitting Diodes, Proc. of SPIE 8460:846011-1-846011-6 (2012).

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

\* cited by examiner

US 10,453,826 B2

VOLTAGE-BALANCED SERIAL ILED PIXEL AND DISPLAY

PRIORITY APPLICATION

This application claims priority to and benefit of U.S. Patent Application No. 62/345,304, filed Jun. 3, 2016, entitled Voltage-Balanced Serial iLED Pixel and Display, the content of which is hereby incorporated by reference in its entirety.

FIELD OF THE INVENTION

The present invention relates to displays with inorganic light-emitting diode pixels.

BACKGROUND OF THE INVENTION

Large-format inorganic light-emitting diode (iLED) displays are used in outdoor and stadium displays. Because the iLEDs are relatively large, for example one square millimeter, they are restricted to relatively low-resolution displays. However, as iLED technology develops, there is increasing interest in applying smaller iLEDs to displays having higher resolution. Full-color displays typically include pixels with three (or more) emitters, usually red, green, and blue emitters, distributed in an array over the display surface.

Inorganic light-emitting diodes are semiconductor light sources relying on p-n junctions to emit light when a suitable voltage is applied across the light-emitting diode. The color of the light emitted from the iLED corresponds to the energy bandgap of the semiconductor. Thus, different semiconductor materials can produce different colors of light when stimulated with suitably different voltages. Typical materials include InGaN (emitting blue light), AlGaP (emitting green light), and AlGaAs (emitting red light), among many other materials. Blue-light-emitting materials can emit light at voltages ranging from 2.5-3.7 volts, green-light-emitting materials can emit light at voltages ranging from 1.9-4 volts, and red-light-emitting materials can emit light at voltages ranging from 1.6-2 volts.

In order to provide the different voltages needed by the different light-emitting diodes emitting different colors of light in a full-color pixel, a separate power supply can be supplied to each color light emitter in each multi-color pixel. By supplying the appropriate voltages to each light emitter, the light emitters efficiently emit light. However, providing three (or more) different voltage power signals to each multi-color pixel requires three times as many power supplies, lines, and connections, reducing the available space in the display and increasing costs.

Alternatively, a single power supply can be provided to all three different iLEDs in the full-color pixels. In this case the excess voltage is dropped across other circuit components, increasing heat and reducing overall display system power efficiency.

There is a need, therefore, for an improved pixel structure that improves power efficiency and reduces wiring overhead.

SUMMARY OF THE INVENTION

In some embodiments of the present invention, a multi-color inorganic light-emitting diode (iLED) pixel includes a common voltage signal and a common ground signal, for example signals conducted by electrically conductive wires. A first color sub-pixel includes two or more first iLEDs. Each first iLED emits a first color of light when provided with electrical power at a first voltage. The two or more first iLEDs are serially connected between the common voltage signal and the common ground signal. A second color sub-pixel includes one or more second iLEDs. Each second iLED emits a second color of light different from the first color when provided with electrical power at a second voltage different from the first voltage. The one or more second iLEDs are serially connected between the common voltage signal and the common ground signal. The number of first iLEDs is different from the number of second iLEDs. The first color sub-pixel and the second color sub-pixel comprise at least a portion of the multi-color iLED pixel. In some embodiments, a third color sub-pixel includes one or more third iLEDs each emitting a third color of light different from the first and second colors of light when provided with electrical power at a third voltage different from the first or second voltage. The one or more third iLEDs are serially connected between the common voltage signal and the common ground signal. The first, second, and third iLEDs can be red, green and blue iLEDs that emit red, green, and blue light, respectively.

Each multi-color pixel can include a pixel controller that controls the iLEDs in the pixel. The pixel controller can provide control signals for controlling the first and second iLEDs to emit a desired amount of light from each color sub-pixel. When the desired amount of light from each color sub-pixel is the same, in some embodiments, the ratio of a controlling attribute of the first control signal to a controlling attribute of the second control signal is dependent on the ratio of the number of first iLEDs to the number of second iLEDs. Controlling attributers can include voltage, current, or time.

In some embodiments of the present invention, an array of multi-color iLED pixels are disposed on a display substrate to form a display. A display controller can control the entire display and can communicate control signals to the pixel controllers to control the iLEDs in each pixel the display.

Thus, in some embodiments, a multi-color inorganic light-emitting diode (iLED) display includes a display substrate, a common voltage signal and a common ground signal disposed on the display substrate, and a plurality of multi-color pixels disposed in an array over the display substrate. Each multi-color pixel comprises first, second, and third sub-pixels. A first color sub-pixel includes two or more first iLEDs. Each first iLED emits a first color of light when provided with electrical power at a first voltage. The two or more first iLEDs are serially connected between the common voltage signal and the common ground signal. A second color sub-pixel includes one or more second iLEDs. Each second iLED emits a second color of light different from the first color when provided with electrical power at a second voltage different from the first voltage. The one or more second iLEDs are serially connected between the common voltage signal and the common ground signal. A third color sub-pixel includes one or more third iLEDs. Each third iLED emits a third color of light different from the first and second colors when provided with electrical power at a third voltage different from the first voltage or the second voltage. The one or more third iLEDs are serially connected between the common voltage signal and the common ground signal. The number of first iLEDs is different from the number of second iLEDs.

In some embodiments of the display, the multi-color inorganic light-emitting diode (iLED) display comprises a pixel controller that provides control signals for controlling the first, second, and third iLEDs. When the control signals are adapted to control the first, second, and third iLEDs to emit a desired amount of light from each color sub-pixel so that the desired amount of light from each color sub-pixel is the same, the ratio of the first control signal to the second control signal is dependent on the ratio of the number of first iLEDs to the number of second iLEDs, for example on the ratio of a driving voltage, current, or amount of time.

Methods of making a multi-color inorganic light-emitting diode (iLED) pixel includes providing a display substrate having a common voltage signal and a common ground signal on the display substrate, providing a first color sub-pixel including two or more first iLEDs on or over the display substrate, each first iLED emitting a first color of light when provided with electrical power at a first voltage, the two or more first iLEDs serially connected between the common voltage signal and the common ground signal, and providing a second color sub-pixel including one or more second iLEDs on or over the display substrate, each second iLED emitting a second color of light different from the first color when provided with electrical power at a second voltage different from the first voltage, the one or more second iLEDs serially connected between the common voltage signal and the common ground signal. The number of first iLEDs is different from the number of second iLEDs and the first color sub-pixel and the second color sub-pixel comprise at least a portion of the multi-color iLED pixel. In some embodiments of the method, a third color sub-pixel is provided. In some embodiments, a display substrate is provided and a plurality of pixels are disposed on the substrate.

The pixels can be disposed directly on the substrate by micro-transfer printing. Similarly, a micro-transfer printable intermediate substrate can be provided, the iLEDs can be micro-transfer printed to the intermediate substrate, and the intermediate substrate can be micro-transfer printed to the display substrate.

Embodiments of the present invention provide a simple way to reduce power losses in a multi-color inorganic light-emitting diode display pixel.

In one aspect, the disclosed technology includes a multi-color inorganic light-emitting diode (iLED) pixel, including: a common voltage signal and a common ground signal; a first color sub-pixel including two or more first iLEDs, each first iLED emitting a first color of light when provided with electrical power at a first voltage, the two or more first iLEDs serially connected between the common voltage signal and the common ground signal; and a second color sub-pixel including one or more second iLEDs, each second iLED emitting a second color of light different from the first color when provided with electrical power at a second voltage different from the first voltage, the one or more second iLEDs serially connected between the common voltage signal and the common ground signal; wherein the number of first iLEDs is different from the number of second iLEDs; and wherein the first color sub-pixel and the second color sub-pixel comprise at least a portion of the multi-color iLED pixel.

In certain embodiments, the multi-color inorganic light-emitting diode (iLED) pixel includes: a third color sub-pixel including one or more third iLEDs each emitting a third color of light different from the first and second colors of light when provided with electrical power at a third voltage different from the first or second voltage, the one or more third iLEDs serially connected between the common voltage signal and the common ground signal.

In certain embodiments, the first color is red and the first iLED is a red iLED that emits red light, the second color is green and the second iLED is a green iLED that emits green light, and the third color is blue and the third iLED is a blue iLED that emits blue light.

In certain embodiments, the multi-color inorganic light-emitting diode (iLED) pixel includes two serially connected red iLEDs, one green iLED, and one blue iLED.

In certain embodiments, the multi-color inorganic light-emitting diode (iLED) pixel includes three serially connected red iLEDs, two serially connected green iLEDs, and two serially-connected blue iLEDs.

In certain embodiments, a display comprises a plurality of multi-color iLED pixels. In certain embodiments, a display comprises a display substrate and wherein the plurality of multi-color iLED pixels are arranged in an array on, over, or in the display substrate.

In certain embodiments, the multi-color inorganic light-emitting diode (iLED) pixel includes a pixel controller that provides control signals for controlling the first and second iLEDs, and wherein the control signals are adapted to control the first and second iLEDs to emit a desired amount of light from each color sub-pixel.

In certain embodiments, the desired amount of light from each color sub-pixel is the same and the ratio of the first control signal to the second control signal is dependent on the ratio of the number of first iLEDs to the number of second iLEDs.

In another aspect, the disclosed technology includes a method of making a multi-color inorganic light-emitting diode (iLED) pixel, including: providing a display substrate having a common voltage signal and a common ground signal on the display substrate; providing a first color sub-pixel including two or more first iLEDs on or over the display substrate, each first iLED emitting a first color of light when provided with electrical power at a first voltage, the two or more first iLEDs serially connected between the common voltage signal and the common ground signal; and providing a second color sub-pixel including one or more second iLEDs on or over the display substrate, each second iLED emitting a second color of light different from the first color when provided with electrical power at a second voltage different from the first voltage, the one or more second iLEDs serially connected between the common voltage signal and the common ground signal; wherein the number of first iLEDs is different from the number of second iLEDs; and wherein the first color sub-pixel and the second color sub-pixel comprise at least a portion of the multi-color iLED pixel.

In certain embodiments, the method includes providing a plurality of pixels on the display substrate.

In certain embodiments, the method includes micro-transfer printing the first iLEDs from a first source substrate to the display substrate and micro-transfer printing the second iLED(s) from a second source substrate to the display substrate.

In certain embodiments, the method includes providing an intermediate substrate, micro-transfer printing the first iLEDs from a first source substrate to the intermediate substrate and micro-transfer printing the second iLED(s) from a second source substrate to the intermediate substrate to form a pixel.

In certain embodiments, the method includes providing a common voltage signal and a common ground signal on the intermediate substrate, serially connecting the first iLEDS between the common voltage signal and the common ground signal, and serially connecting the one or more second iLEDS between the common voltage signal and the common ground signal.

In certain embodiments, the method includes microtransfer printing the pixel from the intermediate substrate to the display substrate.

In certain embodiments, the method includes providing a pixel controller that provides control signals to control the first and second iLEDs.

In certain embodiments, the method includes providing a pixel controller that provides control signals for controlling the first and second iLEDs, and wherein the control signals are adapted to control the first and second iLEDs to emit the desired amount of light from each color sub-pixel.

In certain embodiments, the desired amount of light from each sub-pixel is the same and comprising controlling the ratio of the first control signal to the second control signal to be dependent on the ratio of the number of first iLEDs to the number of second iLEDs.

In another aspect, the disclosed technology includes a multi-color inorganic light-emitting diode (iLED) display, including: a display substrate; a common voltage signal and a common ground signal disposed on the display substrate; and a plurality of iLED multi-color pixels disposed in an array in, on, or over the display substrate, each multi-color pixel including: a first color sub-pixel including two or more first iLEDs, each first iLED emitting a first color of light when provided with electrical power at a first voltage, the two or more first iLEDs serially connected between the common voltage signal and the common ground signal; a second color sub-pixel including one or more second iLEDs, each second iLED emitting a second color of light different from the first color when provided with electrical power at a second voltage different from the first voltage, the one or more second iLEDs serially connected between the common voltage signal and the common ground signal; and a third color sub-pixel including one or more third iLEDs, each third iLED emitting a third color of light different from the first and second colors when provided with electrical power at a third voltage different from the first voltage or the second voltage, the one or more third iLEDs serially connected between the common voltage signal and the common ground signal; and wherein the number of first iLEDs is different from the number of second iLEDs.

In certain embodiments, the multi-color inorganic light-emitting diode (iLED) display comprises a pixel controller that provides control signals for controlling the first, second, and third iLEDs, and wherein the control signals are adapted to control the first, second, and third iLEDs to emit a desired amount of light from each color sub-pixel, the desired amount of light from each sub-pixel is the same, and the ratio of the first control signal to the second control signal is dependent on the ratio of the number of first iLEDs to the number of second iLEDs.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 2:
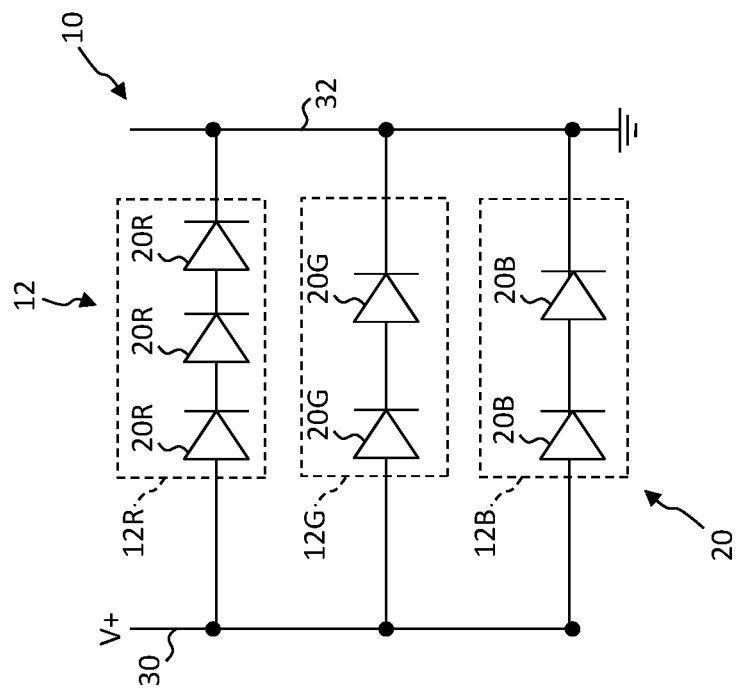
FIG. 2 is a schematic diagram of another illustrative embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 1:
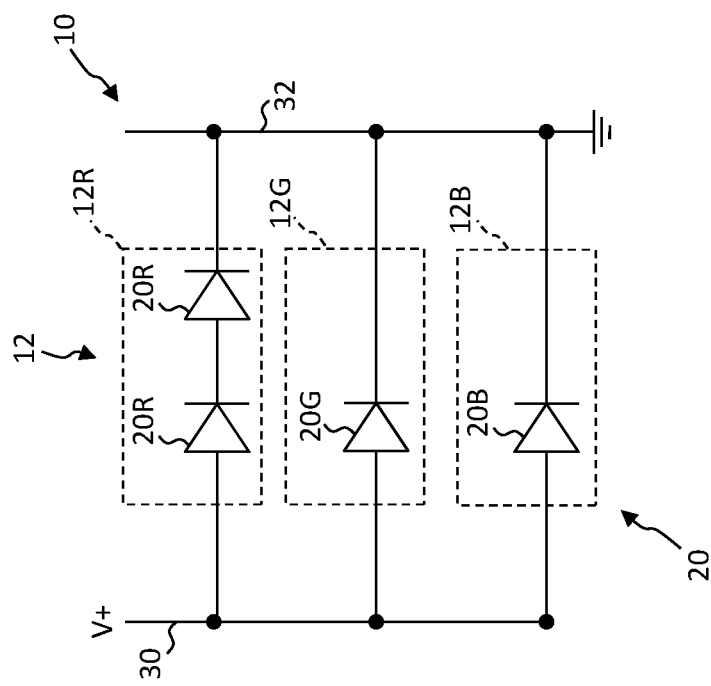
FIG. 1 is a schematic diagram of an illustrative embodiment of the present.

According to some embodiments of the present invention and as illustrated in FIG. 1, a multi-color inorganic light-emitting diode (iLED) pixel 10 includes a common voltage signal 30 and a common ground signal 32. An iLED 20 is a two-terminal inorganic light-emitting semiconductor device that emits light when provided with forward-biased electrical current across its two terminals at a sufficient voltage and with sufficient current. A first color sub-pixel 12R includes two or more first iLEDs 20R. Each first iLED 20R emits a first color of light when provided with electrical power at a first voltage. The two or more first iLEDs 20R are serially connected between the common voltage signal 30 and the common ground signal 32. Similarly, a second color sub-pixel 12G includes one or more second iLEDs 20G. Each second iLED 20G emits a second color of light different from the first color when provided with electrical power at a second voltage different from the first voltage. The one or more second iLEDs 20G are serially connected between the common voltage signal 30 and the common ground signal 32. The number of first iLEDs 20R is different from the number of second iLEDs 20G. The first color sub-pixel 12R and the second color sub-pixel 12G comprise at least a part of the multi-color iLED pixel 10. In some embodiments of the present invention and as shown in FIG. 1, the multi-color iLED pixel 10 further includes a third color sub-pixel 12B including one or more third iLEDs 20B. Each third iLED 20B emits a third color of light different from the first and second colors of light when provided with electrical power at a third voltage different from the first or second voltage. The one or more third iLEDs 20B are serially connected between the common voltage signal 30 and the common ground signal 32.

As used herein, two iLEDs 20 that are serially connected are two iLEDs 20 that are electrically connected in serial, so that the first terminal of an iLED 20 is electrically connected to the second terminal of another iLED 20. The remaining two terminals are electrically connected to the common voltage signal 30 and common ground signal 32, respectively. Both iLEDs 20 are biased in the same forward direction. When the one or more iLEDs 20 is only one iLED 20, the one iLED 20 being serially connected means the iLED 20 is simply electrically connected, by itself, to the common voltage signal and common ground signal, 30, 32.

According to some embodiments of the present invention, the first color is red, the first color sub-pixel 12R is a red sub-pixel, and the first iLED 20R is a red iLED 20R that emits red light; the second color is green, the second color sub-pixel 12G is a green sub-pixel, and the second iLED 20G is a green iLED 20G that emits green light; and the third color is blue, the third color sub-pixel is a blue sub-pixel, and the third iLED 20B is a blue iLED 20B that emits blue light. The first, second, and third color sub-pixels are labeled 12R, 12G, 12B, respectively, and the first, second and third iLEDs are labeled 20R, 20G, 20B for clarity. However, any of the color sub-pixels, collectively sub-pixels 12, and any of the iLEDs, collectively iLEDs 20, can be any color and emit light of any color and the present invention is not limited to any particular colors. For example, the first color sub-pixel 12R can be a yellow sub-pixel or a green sub-pixel and the first iLED 20R can be a yellow iLED that emits yellow light or a green iLED that emits green light. As used herein, color of light and different color mean wavelength of light and different wavelength, respectively. Specifically, different colors need not mean that the colors belong to different color categories (e.g., red, green, blue, yellow).

As shown in FIG. 1, the multi-color iLED pixel 10 comprises a red sub-pixel 12R including two serially connected red iLEDs 20R, a green sub-pixel 12G including one green iLED 20G, and a blue sub-pixel 12B including one blue iLED 20B. As shown in FIG. 2, the multi-color iLED pixel 10 comprises a red sub-pixel 12R including three serially connected red iLEDs 20R, a green sub-pixel 12G including two serially connected green iLEDs 20G, and a blue sub-pixel 12B including two serially-connected blue iLEDs 20B.

According to embodiments of the present invention, a common power supply or power connection (common voltage signal 30) provides power at a common voltage to all of the iLEDs 20 in the multi-color iLED pixel 10. However, at least two of the first, second, and third voltages are different so that the common voltage is not well suited to at least one iLED 20. For example, the red iLED 20R can have a voltage of 2.075 V and operate at a current of 0.36 µA, the green iLED 20G can have a voltage of 3.308 V and operate at a current of 0.204 µA, and the blue iLED 20B can have a voltage of 2.921 V and operate at a current of 0.112 µA for best efficiency. A conventional arrangement having one iLED 20 of each color in the multi-color pixel and a common power supply will waste 0.487 µM. In contrast, the embodiment of FIG. 1 will waste only 0.309 µW and the embodiment of FIG. 2 will waste only 0.09 µW, demonstrating an improvement of approximately 36% and 81% respectively.

Figure 3:
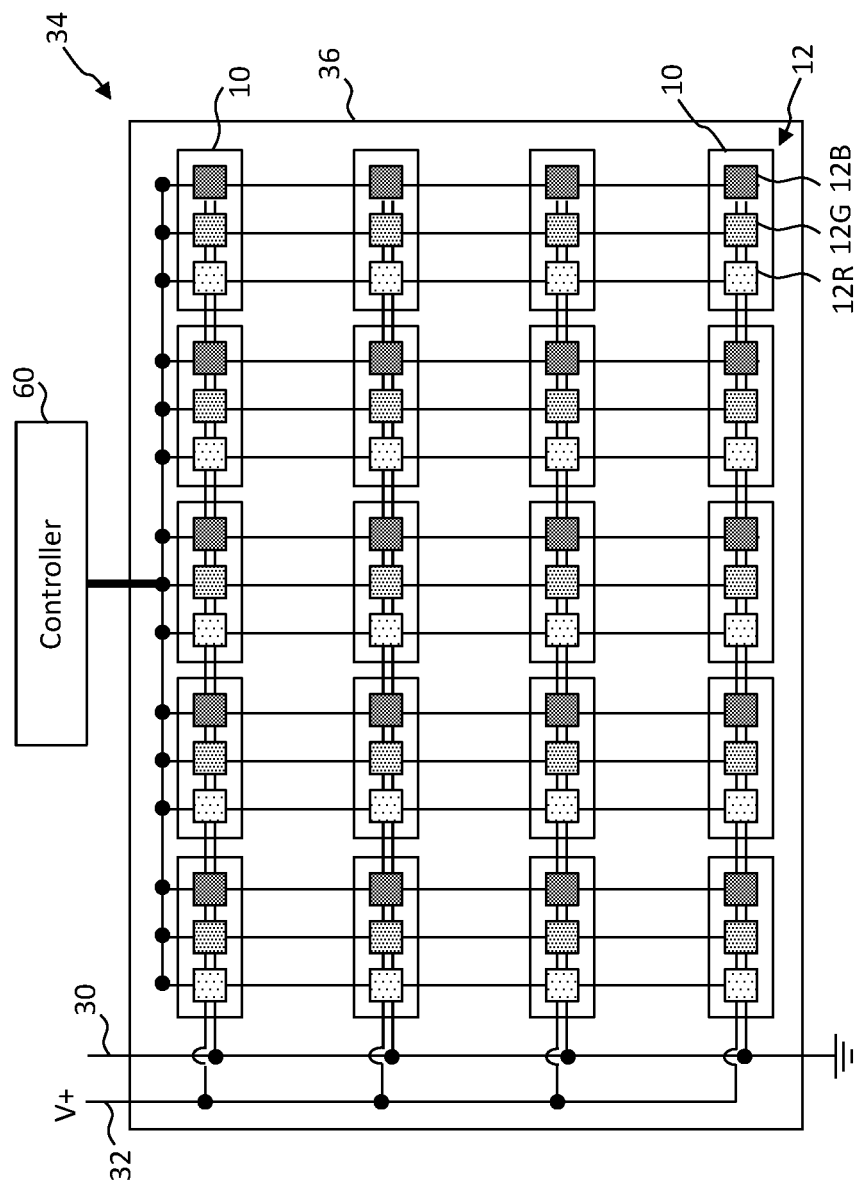
FIG. 3 is a schematic diagram of a display according to an illustrative embodiment of the present invention.

Referring to FIG. 3, in some embodiments of the present invention, a display 34 includes a plurality of multi-color iLED pixels 10. (In FIG. 3, the color sub-pixels 12 are illustrated, but not the iLEDs 20 within the color sub-pixels 12.) The plurality of multi-color iLED pixels 10 are arranged in an array on, over, or in the display substrate 36. A pixel controller 60 provides control signals for controlling the color sub-pixels 12 and first and second iLEDs 20R, 20G (FIGS. 1, 2). The control signals are adapted to control the first and second iLEDs 20R, 20G to emit a desired amount of light from each color sub-pixel 12.

In some embodiments, the desired amount of light from each color sub-pixel 12 is the same and the ratio of the first control signal to the second control signal is dependent on the ratio of the number of first iLEDs 20R to the number of second iLEDs 20G. Thus, the control signals provided by the pixel controller 60 compensate for the different numbers of iLEDs 20 in the different color sub-pixels 12. For example, if twice as many red iLEDs 20R are provided in the red sub-pixel 12R, the control signal can control the red iLEDs 20R to each emit half as much light. As intended herein, a ratio of the first control signal to the second control signal is a ratio of an operative attribute of the mechanism that controls the amount of light emitted by each iLED 20. For example, if the voltage is varied to vary the amount of light emitted by each iLED 20, then the ratio of the control signals is a voltage ratio. If the current is varied to vary the amount of light emitted by each iLED 20, then the ratio of the control signals is a current ratio. If the iLEDs 20 are driven with a constant voltage and current, then the time for which the iLEDs 20 are driven can be varied, as in a pulse width modulation control scheme, and the ratio of the control signals is a time ratio.

As shown in FIG. 3, a multi-color inorganic light-emitting diode (iLED) display 34 includes a display substrate 36 and a common voltage signal 30 and a common ground signal 32 disposed on the display substrate 36. A plurality of multi-color pixels 10 are disposed in an array over the display substrate 36. Each multi-color pixel 10 includes a first color sub-pixel 12R having two or more first iLEDs 20R. (The iLEDs are not shown in FIG. 3 but are shown in FIGS. 1 and 2.) Each first iLED 20R emits a first color of light when provided with electrical power at a first voltage. The two or more first iLEDs 20R are serially connected between the common voltage signal 30 and the common ground signal 32. The multi-color pixel 10 also includes a second color sub-pixel 12G having one or more second iLEDs 20G. Each second iLED 20G emits a second color of light different from the first color when provided with electrical power at a second voltage different from the first voltage. The one or more second iLEDs 20G are serially connected between the common voltage signal 30 and the common ground signal 32. The multi-color pixel 10 further includes a third color sub-pixel 12B including one or more third iLEDs 20B. Each third iLED 20B emits a third color of light different from the first and second colors when provided with electrical power at a third voltage different from the first voltage or the second voltage. The two or more third iLEDs 20B are serially connected between the common voltage signal 30 and the common ground signal 32. In some embodiments, the multi-color inorganic light-emitting diode (iLED) display 34 further includes a pixel controller 60 that provides control signals for controlling the first, second, and third iLEDs 20, for example with an active-matrix controller. Passive-matrix control without a pixel controller 60 are also possible, rely on row and column passive-matrix drivers, and are included in some embodiments of the present invention. The control signals are adapted to control the first, second, and third iLEDs 20 to emit a desired amount of light from each color sub-pixel 12. When the desired amount of light from each color sub-pixel 12 is the same, the ratio of the first control signal to the second control signal can be dependent on the ratio of the number of first iLEDs 20R to the number of second iLEDs 20G.

Figure 4:
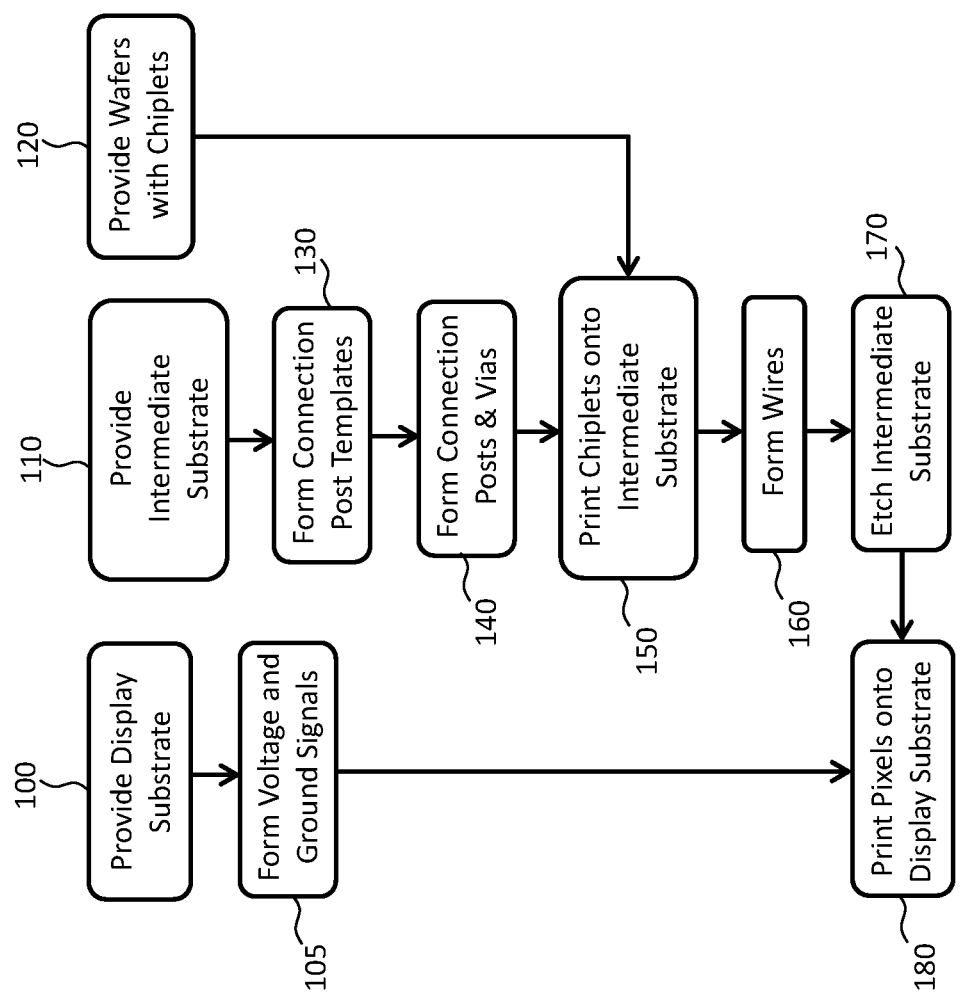
FIG. 4 is a flow chart illustrating an exemplary method of the present invention.
Figure 5:
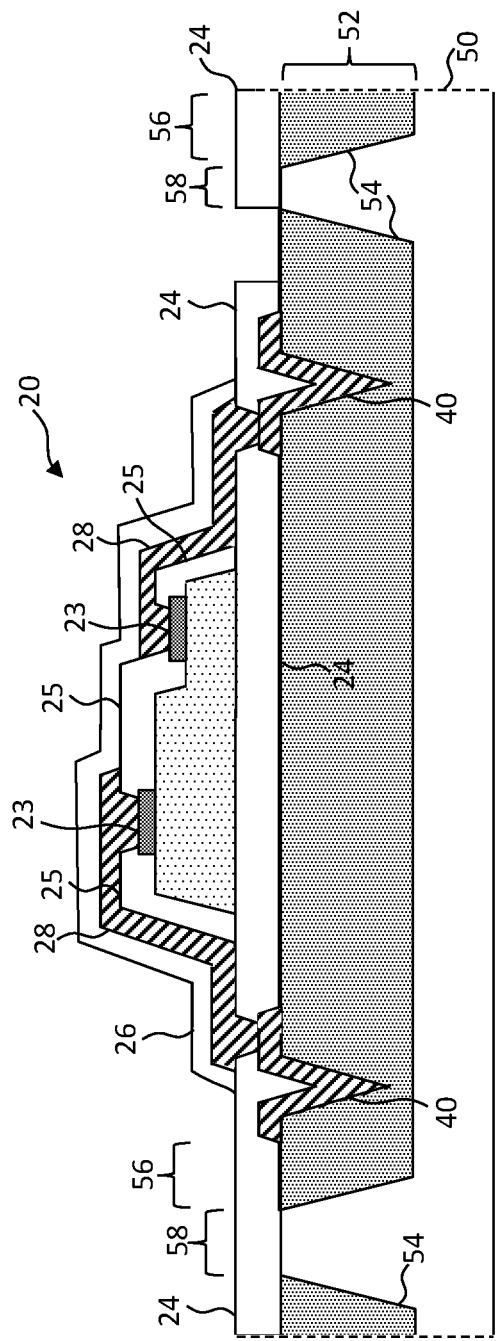
FIGS. 5-7 are cross sections according to various embodiments of the present.

Referring to the flow diagram of FIG. 4, a method of making a multi-color inorganic light-emitting diode (iLED) pixel 10 includes providing a display substrate 36 in step 100. A common voltage signal 30 and a common ground signal 32 are disposed on the display substrate 36 in step 105. Alternatively, the display substrate 36 can be provided with the common voltage signal 30 and a common ground signal 32 in place in step 100. Referring also to FIG. 5, in step 110 an intermediate substrate 50 is provided for example as a semiconductor or glass wafer. The intermediate substrate 50 can have a patterned sacrificial layer 52 defining sacrificial portions 54 connected to anchor 58 portions with tethers 56. Although a variety of methods can be used to form the connection posts 40, in one embodiment a connection post form is made in the sacrificial portion 54 for each connection post 40 in step 130, for example by etching. The connection post form can be a pyramidal depression or other depression with a similar cross section (e.g., a conical depression). The connection posts 40 are then constructed in step 140 by forming a patterned metal layer over the form. A patterned dielectric layer 24 is formed over the patterned sacrificial layer 52 with a via made through the patterned dielectric layer 24 and an opening for etching the sacrificial portions 54.

In step 120, one or more wafers each having an array of micro-transfer printable circuit chiplets, for example iLEDs 20 or active-matrix pixel controller 60 circuits are provided. Each wafer can be made using different materials and process technologies, so that the chiplets are a heterogeneous group of chiplets. In particular, the wafers can be source wafers for the different red, green, and blue iLEDs 20R, 20G, 20B and pixel controller 60 and be made of different compound semiconductor or single semiconductor materials.

An inorganic LED 20 is micro-transfer printed onto the patterned dielectric layer 24 from a source wafer in step 150. A patterned dielectric structure 25 is formed to insulate the iLED 20 and provide vias for LED contacts 23, and electrodes 28 are patterned over the iLED contacts 23 and the dielectric structure 25 in electrical contact with the connection posts 40 in step 160. A plurality of inorganic iLEDs 20 may be micro-transfer printed and electrically connected in steps 150 and 160. In some embodiments, wires are formed in step 160 to electrically connect the circuit chiplets to each other and the connection posts 40, for example using photolithographic processes and materials. An encapsulation layer 26 can be provided to protect the structure from environmental or mechanical damage. The structures and layers illustrated in FIG. 5 can be made using integrated circuit and display industry materials and methods.

The micro-transfer printable circuit chiplets micro-transfer printed in step 150 onto the intermediate substrate 50 are printed using a transfer stamp to press against the micro-transfer printable circuit chiplets on the respective source wafers to fracture the tethers 56, and adhere the circuit chiplets to the transfer stamp. The stamp is then moved to the intermediate substrate 50 and the circuit chiplets pressed against and adhered to the intermediate substrate 50. The intermediate substrate 50 can have an adhesive layer (not shown). In certain embodiments, after the circuit chiplets are disposed on the adhesive layer, the adhesive layer can be cured. In some embodiments, multiple multi-color inorganic light-emitting diode pixels 10, each including two or more iLEDs 20 and a pixel controller 60, are disposed on the intermediate substrate 50, and can be disposed in common steps, for example micro-transfer printing many iLEDs 20 from a common source wafer to the intermediate substrate 50 in one printing procedure or micro-transfer printing many pixel controllers 60 from a common source wafer to the intermediate substrate 50 in one printing procedure.

Figure 6:
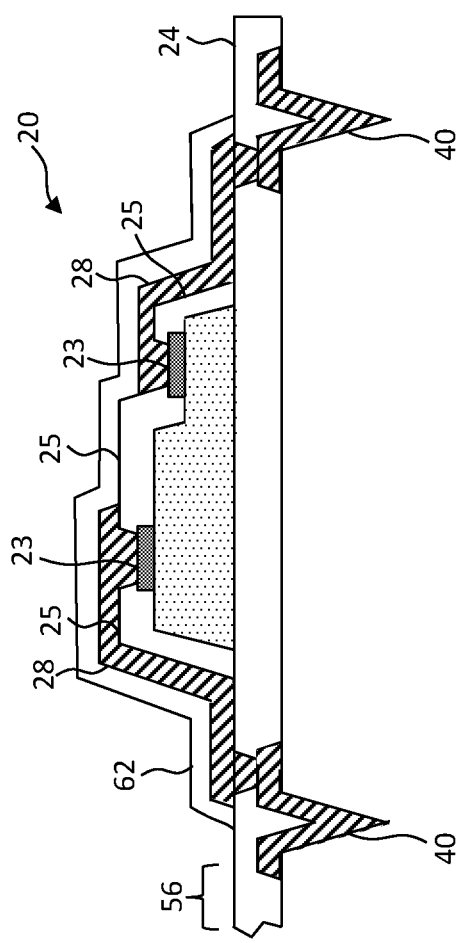
Figure 7:
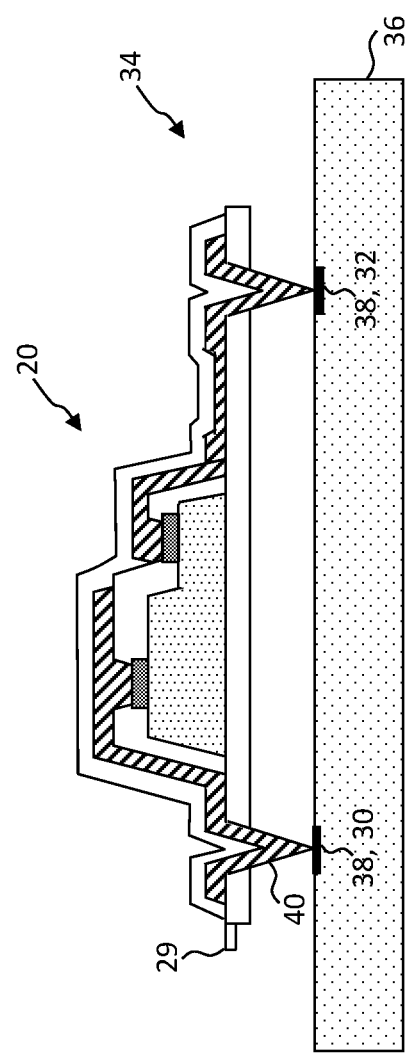

In step 170, the sacrificial portions 54 of the intermediate substrate 50 are etched to release the full-color pixels 10 from the intermediate substrate (as shown in FIG. 6) and the full-color pixels are, in turn, micro-transfer printed in step 180 onto the display substrate 36. Note that the tether 56 is illustrated as fractured in FIG. 6. As shown in FIG. 7, the connection posts 40 are electrically connected to display contact pads 38 electrically connected to or part of the common voltage and ground signals 30, 32 on the display substrate 36. In general, sacrificial portions 54 can be etched to form tethers 56 connecting the iLED 20 or other pixel component, such as the pixel controller 60, to the anchor 58 and a gap between the circuit element and the source wafer, enabling the circuit element to be micro-transfer printed with the transfer stamp by fracturing the tethers 56 to adhere the circuit element to the stamp, transporting the stamp to a destination substrate such as the display substrate 36, and pressing the circuit elements to the destination substrate to adhere the circuit elements to the destination substrate. The iLED 20, pixels 10, or other pixel component, such as the pixel controller 60, can be connected to the intermediate substrate by one or more tethers, each of which is fractured during micro-transfer printing. The sacrificial portions 54 can be, for example, an oxide layer or a designated anisotropically etchable portion of the source wafer, or, once etched, the gap between the circuit element and the substrate or wafer.

Figure 8:
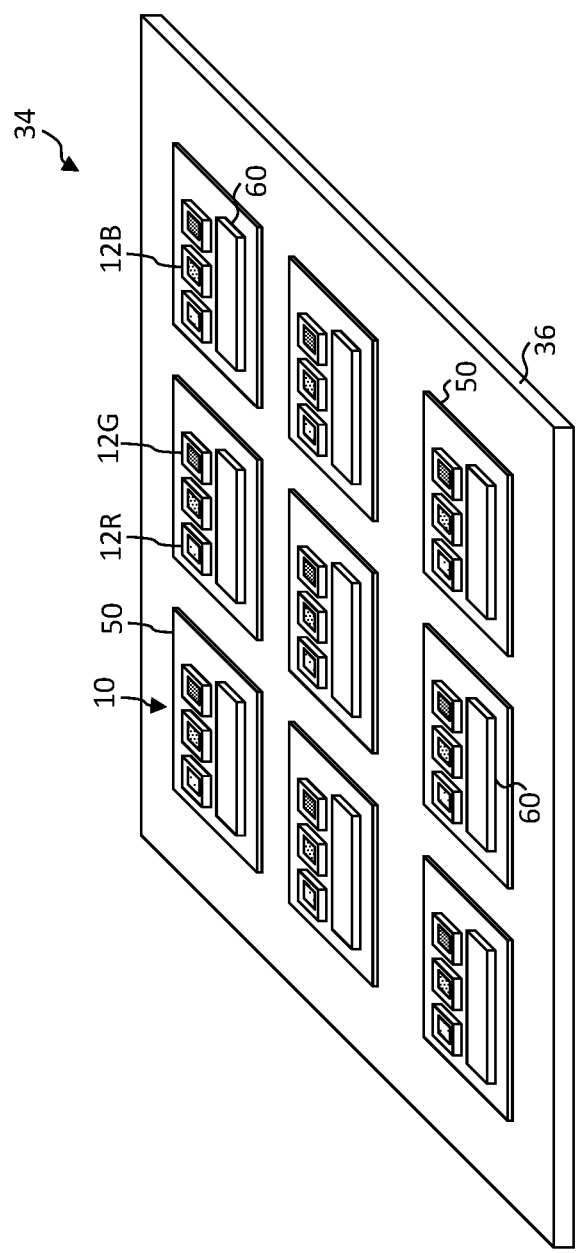
FIG. 8 is a perspective of an illustrative embodiment of the present invention.

In some embodiments of the present invention and as shown in FIG. 8, a plurality of pixels 10 is provided on the display substrate 36 to form a display 34. At least some of the pixels 10 can be provided in common steps and at the same time in a common micro-transfer printing step.

The micro-transfer printed chiplets, for example iLEDs 20 or active-matrix pixel control circuits, on the intermediate substrate 50 can form a full-color pixel 10 including first and second iLEDs 20R, 20G that are controlled by a pixel controller 60 with control signals. The control signals can be adapted to control the first and second iLEDs 20R, 20G to emit the desired amount of light from each color sub-pixel. Each of the first and second iLEDs 20R, 20G or the pixel controller 60 can be micro-transfer printed to the intermediate substrate 50 or, if the intermediate substrate 50 is a semiconductor substrate, a control circuit for controlling the iLEDs 20 can be formed in the semiconductor substrate. For example, in some embodiments, a first color sub-pixel 12R including two or more first iLEDs 20R is provided on or over the display substrate 36. Each first iLED 20R emits a first color of light when provided with electrical power at a first voltage and the first iLEDs 20R are serially connected between the common voltage signal 30 and the common ground signal 32. A second color sub-pixel 12G including one or more second iLEDs 20G is provided on or over the display substrate 36, each second iLED 20G emitting a second color of light different from the first color when provided with electrical power at a second voltage different from the first voltage. The first iLEDs 20R can be micro-transfer printed from a first source substrate to the display substrate 36 and the second iLED(s) 20G can be micro-transfer printed from a second source substrate to the display substrate 36. In some embodiments, a method of the present invention can include providing an intermediate substrate 50, micro-transfer printing the first iLEDs 20R from the first source substrate to the intermediate substrate 50 and micro-transfer printing the second iLED(s) 20G from a second source substrate to the intermediate substrate 50 to form the full-color iLED pixel 10. The full-color iLED pixels 10 on the intermediate substrate 50 can then be micro-transfer printed to a display substrate 36 to forma display 34.

The one or more second iLEDs 20G are serially connected between the common voltage signal 30 and the common ground signal 32. The first color sub-pixel 12R and the second color sub-pixel 12G form the multi-color iLED pixel 10. Thus, methods of the present invention can include providing a common voltage signal 30 and a common ground signal 32 on the intermediate substrate 50, serially connecting the first iLEDs 20R between the common voltage signal 30 and the common ground signal 32, and serially connecting the one or more second iLEDs 20G between the common voltage signal 30 and the common ground signal 32.

In some embodiments of the present invention, when the desired amount of light from each of the first and second sub-pixels 12R, 12G is the same, the ratio of the first control signal to the second control signal is controlled to be dependent on the ratio of the number of first iLEDs 20R to the number of second iLEDs 20G.

According to embodiments of the present invention, the display substrate 36 is a substrate having substantially parallel and opposing sides, on one of which the color pixels 12 are disposed. The display substrate 36 can be a glass, polymer, ceramic, or metal substrate having at least one side suitable for constructing electrical conductors. The display substrate 36 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm and can be, but is not necessarily, transparent.

The common voltage and ground signals 30, 32 can be made using photolithographic, printed circuit board, inkjet, or display techniques and materials, for example using copper, aluminum, or silver materials to form patterned electrical conductors that conduct electrical control and power signals to the pixels to enable the pixels to display information, for example an image. The electrical conductors can be electrically conductive metal wires formed, or disposed on, the display substrate 36 using, for example, photolithographic methods, tools, and materials. Similarly, the electrodes 28 can be made using photolithographic methods, tools, and materials.

The intermediate substrate 50 can also be glass or plastic or can be a semiconductor, such as silicon. The intermediate and display substrates 50, 36 can be transparent or opaque and, if transparent, light emitted from the LEDs can be transmitted through the intermediate or display substrates 50, 36, depending on the orientation and structure of the intermediate or display substrates 50, 36.

The source wafers can be compound semiconductor or silicon wafers and the patterned sacrificial layer 52, tethers 56, and circuit element structures can be made using photolithographic methods and materials found in the integrated circuit industries. For example, a source wafer can be GaN, InGaN, or GaAs. The inorganic light-emitting diodes 20 can be inorganic light-emitting diodes made in a semiconductor material, such as a compound semiconductor (e.g., GaN). The semiconductor material can be crystalline. Any one or each of the iLEDs 20 can have a width from 2 to 5 µm, 5 to 10 µm, 10 to 20 µm, or 20 to 50 µm, has a length from 2 to 5 µm, 5 to 10 µm, 10 to 20 µm, or 20 to 50 µm, or has a height from 2 to 5 µm, 4 to 10 µm, 10 to 20 µm, or 20 to 50 µm.

In operation, power, ground, and control signals are applied to electrical conductors on the display substrate 36. The electrical conductors on the display substrate 36 are in electrical contact with the connection posts 40 of the multi-color iLED pixels 10 and supply electrical power at a desired voltage to the common voltage signal 30, supply an electrical ground signal to the common ground signal 32, and supply control signals to other connection posts 40. The ground, voltage, and control signals are electrically conducted by the connection posts 40 and the electrodes 28 to the iLEDs 20 and pixel controller 60 to control the iLEDs 20 to emit light. The iLEDs 20 can be controlled using passive-matrix or active-matrix methods.

Methods of forming useful micro-transfer printable structures are described, for example, in the paper AMOLED Displays using Transfer-Printed Integrated Circuits and U.S. Pat. No. 8,889,485. For a discussion of micro-transfer printing techniques see, U.S. Pat. Nos. 8,722,458, 7,622,367 and 8,506,867, the disclosure of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, the disclosure of which is hereby incorporated by reference in its entirety. In some embodiments, the pixel 10 is a compound micro-assembled device.

According to various embodiments of the present invention, source wafers can be provided with iLEDs 20, release layers (patterned sacrificial layer 52), tethers 56, and connection posts 40 already formed, or they can be constructed during display fabrication. Similarly, any source wafers having micro-transfer printable LEDs 20 thereon can be constructed or transfer printed during display fabrication.

Connection posts 40 are electrical connections formed on a side of a micro-transfer printable element such as the iLED 20, circuit element, or pixel that extend generally perpendicular to a surface of the element. Such connection posts 40 can be formed from metals such as aluminum, titanium, tungsten, copper, silver, gold, or other conductive metals. In some embodiments, the connection posts 40 are made of one or more high elastic modulus metals, such as tungsten. As used herein, a high elastic modulus is an elastic modulus sufficient to maintain the function and structure of the connection posts 40 when pressed into a display substrate 36 electrical conductors that can include display contact pads 38. In certain embodiments, the display contact pads 38 comprise a material that is softer than that of the connection posts 40. In certain embodiments, the connection posts 40 comprise a material that is softer than that of the display contact pads 38. In certain embodiments, a conductive material other than a material of the contact pad or the connection post 40 adheres or electrically connects, or both, the display contact pad 38 to the connection post 40. In certain embodiments, at least a portion of the display contact pad 38 has a first conductive layer and a second conductive layer over the first conductive layer, and the second conductive layer has a lower melting temperature than the first conductive layer. In embodiments, the display contact pad 38 is coated with a non-conductive layer or the display contact pad 38 is formed on a compliant non-conductive layer. In certain embodiments, the second conductive layer is a solder. In certain embodiments, the display contact pad 38 is welded to the connection post 40. In certain embodiments, the display contact pads 38 are non-planar and the connection posts 40 are inserted into the display contact pads 38.

The display substrate 36 contact pads 38 can be made of or include a relatively soft metal, such as tin, solder, or tin-based solder, to assist in forming good electrical contact with the connection posts 40 and adhesion with the elements. As used herein, a soft metal may refer to a metal into which a connection post 40 can be pressed to form an electrical connection between the connection post 40 and the display contact pads 38. In this arrangement, the display contact pads 38 can plastically deform and flow under mechanical pressure to provide a good electrical connection between the connection post 40 and the display contact pads 38.

In other embodiments of the present invention, the connection posts 40 can include a soft metal and the display contact pads 38 include a high elastic modulus metal. In this arrangement, the connection posts 40 can plastically deform and flow under mechanical pressure to provide a good electrical connection between the connection post 40 and the display contact pads 38.

If an optional layer of adhesive is formed on the display substrate 36, the connection posts 40 can be driven through the adhesive layer to form an electrical connection with the display contact pads 38 beneath the adhesive layer. In certain embodiments, the adhesive layer can be cured to more firmly adhere the element and maintain a robust electrical connection between the connection posts 40 and display contact pads 38 in the presence of mechanical stress. In certain embodiments, the adhesive layer undergoes some shrinkage during the curing process that can further strengthen the electrical connectivity and adhesion between the connection post 40 and the display contact pads 38.

In certain embodiments of the present invention, the connection posts 40 are in contact with, are embedded in, or pierce the display contact pads 38 of the element. In some embodiments, either or both one or more of the connection posts 40 and the display contact pads 38 are deformed or crumpled into a non-planar shape or are deformed so that the surfaces of the connection posts 40 and the display contact pads 38 change shape on contact with each other. The deformation or crumpling can improve the electrical connection between the connection posts 40 and the display contact pads 38 by increasing the surface area that is in contact between the connection posts 40 and the display contact pads 38. To facilitate deformation, in some embodiments, the connection posts 40 have a composition softer than that of the display contact pads 38 or the display contact pads 38 have a composition softer than the connection posts 40.

Micro-transfer printable elements can be constructed using foundry fabrication processes used in the art. Layers of materials can be used, including materials such as metals, oxides, nitrides and other materials used in the integrated-circuit art. Each element can be or include a complete semiconductor integrated circuit and can include, for example, transistors. The elements can have different sizes, for example, 1000 square microns or 10,000 square microns, 100,000 square microns, or 1 square mm, or larger, and can have variable aspect ratios, for example 1:1, 2:1, 5:1, or 10:1. The elements can be rectangular or can have other shapes.

Embodiments of the present invention provide advantages over other printing methods described in the prior art. By employing connection posts 40 and a printing method that provides micro-transfer printable element on a destination substrate and connection posts 40 adjacent to the destination substrate, a low-cost method for printing elements in large quantities over a destination substrate is provided. Furthermore, in some embodiments, additional process steps for electrically connecting the micro-transfer printable elements to the destination substrate are obviated.

The element source wafer and micro-transfer printable elements, micro-transfer printing stamps, and destination substrates can be made separately and at different times or in different temporal orders or locations and provided in various process states.

The method of some embodiments of the present invention can be iteratively applied to a single or multiple destination substrates. By repeatedly transferring sub-arrays of micro-transfer printable elements from a transfer stamp to a destination substrate and relatively moving the transfer stamp and destination substrates between stamping operations size of the selected micro-transfer printable elements in the transferred sub-array between each transfer of micro-transfer printable elements, an array of micro-transfer printable elements formed at a high density on a source wafer (e.g., intermediate wafer 50) can be transferred to a destination substrate (e.g., the display substrate 36) at a much lower density. In practice, the source wafer is likely to be expensive, and forming micro-transfer printable elements with a high density on the source wafer will reduce the cost of the micro-transfer printable elements, especially as compared to micro-transfer printable elements on the destination substrate.

In particular, in the case wherein the active micro-transfer printable elements are or include an integrated circuit formed in a crystalline semiconductor material, the integrated circuit substrate provides sufficient cohesion, strength, and flexibility that it can adhere to the destination substrate without breaking as the transfer stamp is removed.

In comparison to thin-film manufacturing methods, using densely populated source substrate wafers and transferring micro-transfer printable elements to a destination substrate that requires only a sparse array of micro-transfer printable elements located thereon does not waste or require active layer material on a destination substrate. The present invention can also be used in transferring micro-transfer printable elements made with crystalline semiconductor materials that have higher performance than thin-film active components. Furthermore, the flatness, smoothness, chemical stability, and heat stability requirements for a destination substrate used in embodiments of the present invention may be reduced because the adhesion and transfer process is not substantially limited by the material properties of the destination substrate. Manufacturing and material costs may be reduced because of high utilization rates of more expensive materials (e.g., the source substrate) and reduced material and processing requirements for the destination substrate.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 multi-color inorganic light-emitting diode (iLED) pixel
12 color sub-pixel
12R first color sub-pixel/red sub-pixel
12G second color sub-pixel/green sub-pixel
12B third color sub-pixel/blue sub-pixel
20 inorganic LED
20R red iLED/first iLED
20G green iLED/second iLED
20B blue iLED/third iLED
23 LED contact pad
24 patterned dielectric layer
25 dielectric structure
26 encapsulation layer
28 electrode
30 common voltage signal
32 common ground signal
34 display
36 display substrate
38 display contact pad
40 connection post
50 intermediate substrate
52 patterned sacrificial layer
54 sacrificial portion
56 tether
58 anchor
60 pixel controller
100 provide display substrate step
105 form voltage and ground signals step
110 provide intermediate substrate step
120 provide wafer with chiplets step
130 form connection post templates step
140 form connection posts and vias step
150 print chiplets onto intermediate substrate step
160 form wires step
170 etch intermediate substrate step
180 print pixels onto display substrate step

What is claimed:

1. A multi-color inorganic light-emitting diode (iLED) pixel, comprising:
a common voltage signal and a common ground signal;
a first color sub-pixel comprising two or more first iLEDs, each first iLED emitting a first color of light when provided with electrical power at a first voltage, the two or more first iLEDs serially connected between the common voltage signal and the common ground signal;
a second color sub-pixel comprising one or more second iLEDs, each second iLED emitting a second color of light different from the first color when provided with electrical power at a second voltage different from the first voltage, the one or more second iLEDs serially connected between the common voltage signal and the common ground signal;
a third color sub-pixel comprising one or more third iLEDs each emitting a third color of light different from the first and second colors of light when provided with electrical power at a third voltage different from the first or second voltage, the one or more third iLEDs serially connected between the common voltage signal and the common ground signal; and
a pixel controller that provides a first control signal for controlling the one or more first iLEDs to emit light and a second control signal for controlling the one or more second iLEDs to emit light,
wherein the number of first iLEDs is different from the number of second iLEDs and the number of second iLEDs is the same as the number of third iLEDs,
wherein a ratio of a controlling attribute of the first control signal to a controlling attribute of the second control signal is dependent on a ratio of the number of first iLEDs to the number of second iLEDs, and
wherein at least one iLED of the first color sub-pixel, the second color sub-pixel, or the third color sub-pixel has a width from 2 to 5 µm, 5 to 10 µm, 10 to 20 µm, or 20 to 50 µm, has a length from 2 to 5 µm, 5 to 10 µm, 10 to 20 µm, or 20 to 50 µm, or has a height from 2 to 5 µm, 4 to 10 µm, 10 to 20 µm, or 20 to 50 µm.

2. The multi-color inorganic light-emitting diode (iLED) pixel of claim 1, wherein the first color is red and the first iLED is a red iLED that emits red light, the second color is green and the second iLED is a green iLED that emits green light, and the third color is blue and the third iLED is a blue iLED that emits blue light.

3. The multi-color inorganic light-emitting diode (iLED) pixel of claim 1, comprising two serially connected red iLEDs, one green iLED, and one blue iLED.

4. The multi-color inorganic light-emitting diode (iLED) pixel of claim 1, comprising three serially connected red iLEDs, two serially connected green iLEDs, and two serially-connected blue iLEDs.

5. A method of making a multi-color inorganic light-emitting diode (iLED) pixel, comprising:
providing a display substrate having a common voltage signal and a common ground signal on the display substrate;
providing a first color sub-pixel comprising two or more first iLEDs on or over the display substrate, each first iLED emitting a first color of light when provided with electrical power at a first voltage, the two or more first iLEDs serially connected between the common voltage signal and the common ground signal; and
providing a second color sub-pixel comprising one or more second iLEDs on or over the display substrate, each second iLED emitting a second color of light different from the first color when provided with electrical power at a second voltage different from the first voltage, the one or more second iLEDs serially connected between the common voltage signal and the common ground signal;
providing a third color sub-pixel comprising one or more third iLEDs on or over the display substrate, each third iLED emitting a third color of light different from the first and second colors of light when provided with electrical power at a third voltage different from the first or second voltage, the one or more third iLEDs serially connected between the common voltage signal and the common ground signal; and
providing a pixel controller that provides a first control signal for controlling the one or more first iLEDs to emit light and a second control signal for controlling the one or more second iLEDs to emit light,
wherein the number of first iLEDs is different from the number of second iLEDs and the number of second iLEDs is the same as the number of third iLEDs,
wherein a ratio of a controlling attribute of the first control signal to a controlling attribute of the second control signal is dependent on a ratio of the number of first iLEDs to the number of second iLEDs, and wherein at least one iLED of the first color sub-pixel, the second color sub-pixel, or the third color sub-pixel has a width from 2 to 5 µm, 5 to 10 µm, 10 to 20 µm, or 20 to 50 µm, has a length from 2 to 5 µm, 5 to 10 µm, 10 to 20 µm, or 20 to 50 µm, or has a height from 2 to 5 µm, 4 to 10 µm, 10 to 20 µm, or 20 to 50 µm.

6. The method of claim 5, comprising providing a plurality of pixels on the display substrate.

7. The method of claim 5, comprising micro-transfer printing the first iLEDs from a first source substrate to the display substrate and micro-transfer printing the second iLED(s) from a second source substrate to the display substrate.

8. The method of claim 5, comprising providing an intermediate substrate, micro-transfer printing the first iLEDs from a first source substrate to the intermediate substrate and micro-transfer printing the second iLED(s) from a second source substrate to the intermediate substrate to form a pixel.

9. The method of claim 8, comprising providing a common voltage signal and a common ground signal on the intermediate substrate, serially connecting the first iLEDs between the common voltage signal and the common ground signal, and serially connecting the one or more second iLEDs between the common voltage signal and the common ground signal.

10. The method of claim 8, comprising micro-transfer printing the pixel from the intermediate substrate to the display substrate.

11. The method of claim 8, comprising providing a pixel controller that provides control signals to control the first and second iLEDs.

12. A multi-color inorganic light-emitting diode (iLED) display, comprising:
a display substrate;
a common voltage signal and a common ground signal disposed on the display substrate; and
a plurality of multi-color iLED pixels disposed in an array in, on, or over the display substrate, each multi-color pixel comprising:
a first color sub-pixel comprising two or more first iLEDs, each first iLED emitting a first color of light when provided with electrical power at a first voltage, the two or more first iLEDs serially connected between the common voltage signal and the common ground signal;
a second color sub-pixel comprising one or more second iLEDs, each second iLED emitting a second color of light different from the first color when provided with electrical power at a second voltage different from the first voltage, the one or more second iLEDs serially connected between the common voltage signal and the common ground signal;
a third color sub-pixel comprising one or more third iLEDs, each third iLED emitting a third color of light different from the first and second colors when provided with electrical power at a third voltage different from the first voltage or the second voltage, the one or more third iLEDs serially connected between the common voltage signal and the common ground signal; and
a pixel controller that provides a first control signal for controlling the one or more first iLEDs to emit light and a second control signal for controlling the one or more second iLEDs to emit light,
wherein the number of first iLEDs is different from the number of second iLEDs and the number of second iLEDs is the same as the number of third iLEDs,
wherein a ratio of a controlling attribute of the first control signal to a controlling attribute of the second control signal is dependent on a ratio of the number of first iLEDs to the number of second iLEDs, and
wherein at least one iLED of the first, second, or third iLEDs has a width from 2 to 5 µm, 5 to 10 µm, 10 to 20 µm, or 20 to 50 µm, has a length from 2 to 5 µm, 5 to 10 µm, 10 to 20 µm, or 20 to 50 µm, or has a height from 2 to 5 µm, 4 to 10 µm, 10 to 20 µm, or 20 to 50 µm.

13. The multi-color inorganic light-emitting diode (iLED) pixel of claim 1, wherein any one or more of the first color sub-pixel, the second color sub-pixel, and the third color sub-pixel is a yellow sub-pixel that comprises a yellow iLED that emits yellow light.

14. The multi-color inorganic light-emitting diode (iLED) pixel of claim 1, wherein the controlling attribute is (i) a voltage, (ii) a current, or (iii) a time period at a fixed voltage and a fixed current.

15. The multi-color inorganic light-emitting diode (iLED) pixel of claim 1, comprising a display substrate, wherein the first color sub-pixel, the second color sub-pixel, the third color sub-pixel, and the pixel controller are disposed on the display substrate.

16. The multi-color inorganic light-emitting diode (iLED) pixel of claim 1, comprising a display substrate and an intermediate substrate, wherein the first color sub-pixel, the second color sub-pixel, the third color sub-pixel, and the pixel controller are disposed on the intermediate substrate and the intermediate substrate is disposed on the display substrate.

17. The multi-color inorganic light-emitting diode (iLED) pixel of claim 16, wherein the intermediate substrate comprises connection posts.

18. The multi-color inorganic light-emitting diode (iLED) pixel of claim 16, wherein the intermediate substrate comprises a fractured tether.

19. The multi-color inorganic light-emitting diode (iLED) pixel of claim 1, wherein any one or more of the first iLED, the second iLED, and the third iLED comprises connection posts.

20. The multi-color inorganic light-emitting diode (iLED) pixel of claim 1, wherein any one or more of the first iLED, the second iLED, and the third iLED comprises a fractured tether.

* * * * *